US011108975B2

(12) United States Patent
Cologlu et al.

(10) Patent No.: US 11,108,975 B2
(45) Date of Patent: Aug. 31, 2021

(54) ON-CHIP BIAS CALIBRATION FOR MICROBOLOMETER DETECTORS AND READOUT INTEGRATED CIRCUITS

(71) Applicant: MIKROSENS ELEKTRONIK SAN. VE TIC.A.S., Ankara (TR)

(72) Inventors: Mustafa Haluk Cologlu, Ankara (TR); Murat Tepegoz, Ankara (TR); Tayfun Akin, Ankara (TR)

(73) Assignee: MIKROSENS ELEKTRONIK SAN. VE TIC.

( * ) Notice: Subject to any disclaimer, the term of this patent is extended or adjusted under 35 U.S.C. 154(b) by 105 days.

(21) Appl. No.: 16/603,794

(22) PCT Filed: Apr. 11, 2018

(86) PCT No.: PCT/IB2018/052526
§ 371 (c)(1),
(2) Date: Oct. 8, 2019

(87) PCT Pub. No.: WO2018/189689
PCT Pub. Date: Oct. 18, 2018

(65) Prior Publication Data
US 2020/0120292 A1    Apr. 16, 2020

Related U.S. Application Data

(60) Provisional application No. 62/484,109, filed on Apr. 11, 2017.

(51) Int. Cl.
*G01J 5/20*    (2006.01)
*H04N 5/33*    (2006.01)
(Continued)

(52) U.S. Cl.
CPC ......... *H04N 5/33* (2013.01); *H01L 27/14649* (2013.01); *H04N 5/3655* (2013.01); *H04N 5/378* (2013.01)

(58) Field of Classification Search
CPC ........ H04N 5/33; H04N 5/3655; H04N 5/378; H04N 5/3651; H01L 27/14649
See application file for complete search history.

(56) References Cited

U.S. PATENT DOCUMENTS

| 6,444,983 B1 | 9/2002 | McManus et al. |
| 2003/0042425 A1* | 3/2003 | Tashiro ................. G01T 1/2928 |
| | | 250/370.11 |

(Continued)

FOREIGN PATENT DOCUMENTS

| WO | WO2010/106286 | 9/2010 |
| WO | WO-2010106286 A1 * | 9/2010 ............... H04N 5/33 |

OTHER PUBLICATIONS

Translation of WO 2010/106286 A1 (Year: 2010).*
(Continued)

*Primary Examiner* — David P Porta
*Assistant Examiner* — Mamadou Faye
(74) *Attorney, Agent, or Firm* — Snell & Wilmer LLP

(57) ABSTRACT

A readout circuit that allows on-chip bias calibration of a microbolometer focal plane array (FPA). The readout circuit includes a memory for storing one or more biasing values for a plurality of pixels within the FPA, the plurality of pixels being arranged in one or more columns and one or more rows within the FPA. The readout circuit further includes a column readout connected to the memory and configured to search for the one or more biasing values and to apply a bias adjustment based on the one or more biasing values to a signal received from the FPA. The readout circuit further includes a column multiplexer connected to the column readout and configured to perform dynamic column selection for one or more columns of pixels within the FPA.

20 Claims, 10 Drawing Sheets

(51) Int. Cl.
*H01L 27/146* (2006.01)
*H04N 5/365* (2011.01)
*H04N 5/378* (2011.01)

(56) References Cited

U.S. PATENT DOCUMENTS

| | | | |
|---|---|---|---|
| 2009/0014653 A1* | 1/2009 | Parrish | G01J 5/24 |
| | | | 250/338.1 |
| 2009/0121139 A1 | 5/2009 | Chamming | |
| 2015/0201141 A1* | 7/2015 | Petilli | H04N 5/3696 |
| | | | 348/301 |
| 2016/0119522 A1* | 4/2016 | Choi | H04N 5/2256 |
| | | | 348/302 |

OTHER PUBLICATIONS

International Search Report and Written Opinion of the International Searching Authority (dated Jun. 27, 2018) for Corresponding International PCT Patent Application No. PCT/IB2018/052526, filed Apr. 11, 2018.

* cited by examiner

ON-CHIP BIAS CALIBRATION FOR MICROBOLOMETER DETECTORS AND READOUT INTEGRATED CIRCUITS

CROSS-REFERENCE TO RELATED APPLICATIONS

This application claims priority to and the benefit of U.S. Provisional Application No. 62/484,109, titled "ON-CHIP BIAS CALIBRATION FOR MICROBOLOMETER DETECTORS AND READOUT INTEGRATED CIRCUITS," filed on Apr. 11, 2017, and the entirety of which is hereby incorporated by reference herein.

BACKGROUND

1. Field of the Invention

This specification relates to methods and apparatus for self-calibrating microbolometer based imaging sensors.

2. Description of the Related Art

The integration between devices, such as a camera, with a microbolometer based imaging sensor, utilizes components of both to interact and perform calibration of the pixels of the focal plane array of the microbolometer based imaging sensor since the pixels output a non-uniform voltage across the array of pixels. The integration and interface utilizes, for example, components of the camera to communicate with components of the sensor to perform bias calibration of the pixels on the sensor. This introduces added complexity, components and communication protocols in designing the camera.

Accordingly, an on-chip bias self-calibrating microbolometer detector reduces the amount of components and the design complexity of developing other devices connected to the microbolometer detector, such as the camera.

SUMMARY OF THE INVENTION

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

A readout circuit assembly for a microbolometer focal plane array (FPA) is disclosed. The readout circuit assembly includes a memory for storing one or more biasing values for a plurality of pixels within the FPA, the plurality of pixels being arranged in one or more columns and one or more rows within the FPA. The readout circuit assembly further includes a column readout connected to the memory and configured to search for the one or more biasing values and to apply a bias adjustment based on the one or more biasing values to a signal received from the FPA. The readout circuit assembly further includes a column multiplexer connected to the column readout and configured to perform dynamic column selection for one or more columns of pixels within the FPA.

A method for on-chip bias calibration of a microbolometer detector is disclosed. The method for on-chip bias calibration of a microbolometer detector including setting a bias value for a pixel in a focal plane array of the microbolometer detector. The method for on-chip bias calibration of a microbolometer detector further including generating an output voltage based on the bias value for the pixel. The method for on-chip bias calibration of a microbolometer detector further including comparing the output voltage to a target voltage. The method for on-chip bias calibration of a microbolometer detector further including adjusting the bias value based on the comparison of the output voltage and the target voltage. The method for on-chip bias calibration of a microbolometer detector further including storing, in a memory, the adjusted bias value for the pixel.

A readout circuit assembly for a microbolometer focal plane array (FPA) is disclosed. The readout circuit assembly includes a memory for storing a biasing value for a pixel, the pixel being one of a plurality of pixels within the FPA. The readout circuit assembly further includes a detector biasing device connected to the memory, the detector biasing device being configured to search for the biasing value and to apply a bias adjustment based on the biasing value. The readout circuit assembly further includes a detector signal amplifier connected to the detector biasing device and configured to amplify the output signal. The readout circuit assembly further includes a detector signal multiplexer connected to the detector signal amplifier.

BRIEF DESCRIPTION OF THE DRAWINGS

Other systems, methods, features, and advantages of the present invention will be or will become apparent to one of ordinary skill in the art upon examination of the following figures and detailed description. It is intended that all such additional systems, methods, features, and advantages be included within this description, be within the scope of the present invention, and be protected by the accompanying claims. Component parts shown in the drawings are not necessarily to scale, and may be exaggerated to better illustrate the important features of the present invention. In the drawings, like reference numerals designate like parts throughout the different views, wherein:

DETAILED DESCRIPTION

In the following detailed description, numerous specific details are set forth to provide an understanding of the present disclosure. It will be apparent, however, to one of ordinary skill in the art that elements of the present disclosure may be practiced without some of these specific details. In other instances, well-known structures and techniques have not been shown in detail to avoid unnecessarily obscuring the present disclosure.

Figure 1:
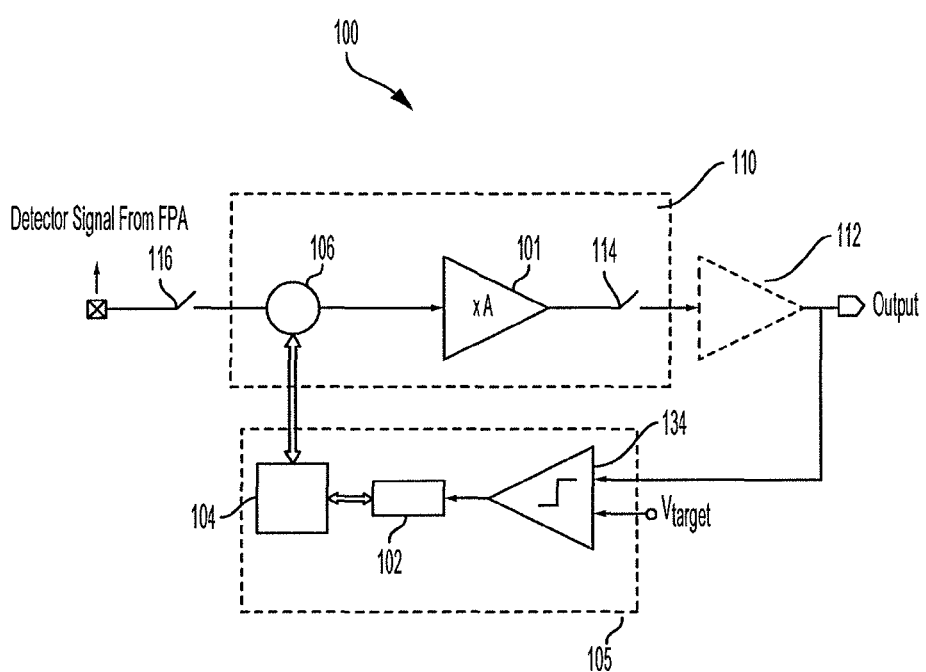
FIG. 1 is a block diagram of a readout circuit that allows on-chip bias calibration of a microbolometer detector focal plane array (FPA), according to an aspect of the invention.

FIG. 1 is a block diagram of a readout circuit 100 that allows on-chip bias calibration of a microbolometer detector according to an aspect of the invention. Readout circuit 100 may be connected to the microbolometer detector and an output.

A microbolometer based imaging sensor may comprise a readout integrated circuit (ROIC). The microbolometer based imaging sensor may have a microbolometer detector array, a focal plane array (FPA), or other array residing on the ROIC. The FPA may have a plurality of pixels organized to form an array having one or more rows of pixels and/or one or more columns of pixels. Each pixel within the plurality of pixels may correspond to a discrete row and/or a discrete column within the FPA. When infrared radiation is received by the microbolometer detector, a detector signal may be produced by each pixel within the plurality of pixels. The resulting detector signal across each pixel may either be uniform or non-uniform.

To correct the non-uniform signals, a bias calibration may be performed using readout circuit 100 for each pixel within the plurality of pixels. A bias calibration may compensate for the non-uniformity of the detector signal across each pixel such that the resulting detector signal is more uniform, which in turn helps reduce noise, increases dynamic range, enables higher readout gains, relaxes input-output voltage swing requirements of the analog circuit blocks inside the readout circuit 100, and expands operating temperature range of the sensor. In some embodiments, the detector biasing and therefore the detector bias calibration may be in the form of a voltage. In other embodiments, the detector biasing and therefore the detector bias calibration may be in the form of an electric current.

Incoming infrared radiation may be first received by the microbolometer detector. A resulting detector signal may then be produced by the microbolometer detector which is subsequently received and amplified by readout circuit 100. A bias calibration may then be performed according to the received detector signal by readout circuit 100. The resulting bias calibrated detector signal may then be outputted by the readout circuit 100.

As shown in FIG. 1, readout circuit 100 may include a row multiplexer 116 connected to a column readout 110 and the microbolometer detector, a buffer 112 connected to column readout 110 and a comparator 134, and a memory 104 connected to a controller 102 and column readout 110. In some embodiments, readout circuit 100 may be on-chip. That is, readout circuit 100 may reside entirely on the microbolometer based imaging sensor which itself comprises a ROIC. In other embodiments, one or more components of readout circuit 100 may reside outside of the microbolometer based imaging sensor. In some embodiments, a digital controller or a timing generator may generate the necessary timings for readout circuit 100. In some embodiments, the necessary timings may be generated by a part of controller 102.

Column readout 110 may include a detector biasing device 106, a detector signal amplifier 101, and a column multiplexer 114. In some embodiments, the various components of readout circuit 100 may be local to column readout 110 (i.e., the various components may be included in column readout 110, or may be global to column readout 110). In some embodiments, each column readout 110 may correspond to one or more columns of pixels within the FPA.

The detector signal from the microbolometer detector may first be received by selecting an FPA row via row multiplexer 116. In some embodiments, row multiplexer 116 may be configured to perform dynamic row selection and to multiplex the detector signal of each pixel for a selected row of pixels within the FPA. After row multiplexer 116 has performed dynamic row selection and has multiplexed the received detector signal, bias calibration may then be performed on the detector signal by on-chip detector bias calibration circuit 105 which controls detector biasing device 106.

Detector biasing device 106 generates one or more biasing values for the pixels of the FPA according to the feedback from memory 104 in on-chip bias calibration circuit 105, which may perform bias calibration on the detector signal by performing a successive approximation within memory 104. The search may be to find one or more biasing values for the pixels of the FPA, which is stored in memory 104. The biasing value may comprise bias calibration that compensates for the non-uniformity of the electrical signal across each pixel. In some embodiments, the biasing value is optimized for each pixel within the plurality of pixels. Detector biasing device 106 may be formed using one or more transistors. In some embodiments, detector biasing device 106 may be formed using single or multi-stage digital-to-analog convertors. In some embodiments, the digital-to-analog convertors may be configured for a voltage output. In other embodiments, the digital-to-analog convertors may be configured for a current output.

After detector biasing device 106 has retrieved the one or more biasing values from memory 104, detector biasing device 106 may apply a bias adjustment to the detector signal. In some embodiments, the bias adjustment may be a bias voltage or a bias current. The applied bias voltage or bias current may be based on the biasing value retrieved from memory 104.

Memory 104 may store the biasing values for each pixel within the plurality of pixels. In some embodiments, memory 104 may be random access memory (RAM) or other volatile or non-volatile memory. Memory 104 may be a non-transitory memory or a data storage device and may further store machine-readable instructions.

In some embodiments, detector biasing device 106 may be in communication with a reference detector. Reference detector may be configured to cancel unwanted signals or noise from the microbolometer detector. In some embodiments, a bias calibration may be performed on the reference detector as well. Bias calibration data for the reference detector may be stored in memory 104. In other embodiments, bias calibration data for the reference detector may be stored in a memory module separate from memory 104.

In some embodiments, after the bias adjustment has been applied to the detector signal, the resulting adjusted detector signal may be received by detector amplifier 101. Detector signal amplifier 101 may be configured to amplify the detector signal. Detector signal amplifier 101 may be formed using one or more transistors, a switched-capacitor integrator, and a line driver. The line driver may have a unity gain configuration. The one or more transistors may be a p-type metal-oxide-semiconductor (PMOS) transistor and/or a n-type metal-oxide-semiconductor (NMOS) transistor. The one or more transistors may be a PNP-type bi-polar junction transistor and/or a NPN-type bi-polar junction transistor (BJT).

After the detector signal has been amplified by detector signal amplifier 101, the resulting amplified detector signal may then be received by column multiplexer 114. Column multiplexer 114 may be configured to perform dynamic column readout output selection and to multiplex the detector signal of each pixel for a selected column of the pixels within the FPA. In some embodiments, the resulting output signal from column multiplexer 114 is received by buffer 112 which drives the output signal to the output. In other embodiments, the resulting output signal from column multiplexer 114 is received directly by the output.

As shown in FIG. 1, buffer 112 is configured as a video buffer, however, other configurations such as an outer buffer, digital buffer, or analog buffer may be used.

The output signal may be used to calibrate subsequently applied bias adjustment to the detector signal during a calibration mode. During the calibration mode, comparator 134 may compare the output voltage or output current with a reference target voltage or a reference target current, $V_{target}$ in FIG. 1. After the comparison, comparator 134 may generate and provide a binary feedback to controller 102 which generates biasing data to be applied on the corresponding detector and writes it into memory 104.

In some embodiments, the reference target voltage may be a target voltage that is uniform across all pixels of the FPA so that the output voltage of each pixel of the FPA is substantially the same. In other embodiments, the reference target current may be a target current that is uniform across all pixels of the FPA so that the output current of each pixel of the FPA is substantially the same.

As shown in FIG. 1, comparator 134 comprises an analog comparator; however, other configurations such as a digital comparator may be used. Comparator 134 is also depicted as a global comparator whereas in other embodiments comparator 134 may be a local comparator. In some embodiments, comparator 134 may reside on the column readout 110. In other embodiments, comparator 134 may reside outside of the column readout 110.

In some embodiments, controller 102 may be configured to generate new biasing values during the calibration mode. Controller 102 may receive the binary feedback from comparator 134, read the biasing values from memory 104, generate new biasing values based on the binary feedback from comparator 134, and write the new biasing values into memory 104 for each pixel of the FPA. After controller 102 has written the new biasing values into memory 104, detector biasing device 106 may then apply bias adjustments based on the new biasing values to the detector signal as described earlier. In some embodiments, controller 102 may be a Successive Approximation Register (SAR) controller.

In some embodiments, the calibration mode may be a discrete number of stages. In other embodiments, the calibration mode may be part of a bias calibration loop.

Figure 2:
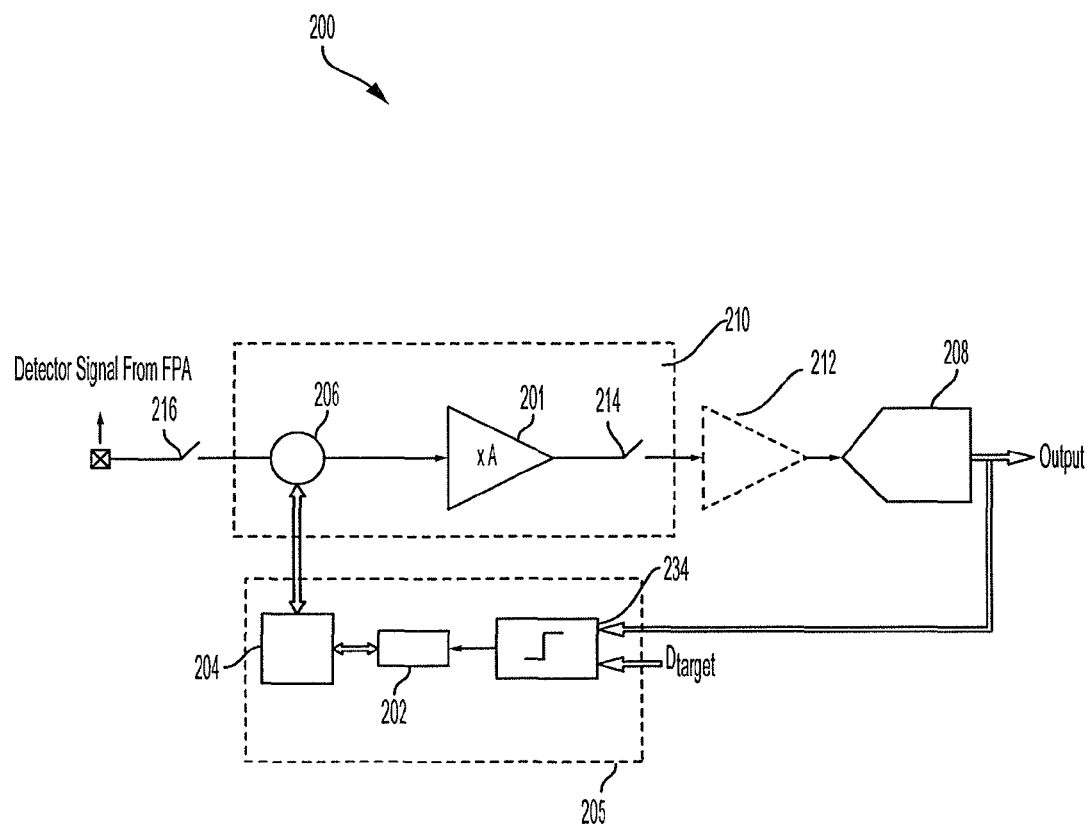
FIG. 2 is a block diagram of a readout circuit that allows on-chip bias calibration of a microbolometer detector focal plane array (FPA), according to an aspect of the invention.

FIG. 2 is a block diagram of system 200, according to various aspects of the invention. System 200 is similar to system 100, and like parts are numbered similarly.

System 200 may include a row multiplexer 216 similar to row multiplexer 116, a column readout 210 similar to column readout 110, a buffer 212 similar to buffer 112, a controller 202 similar to controller 102, and a memory 204 similar to memory 104.

Likewise, the components of column readout 210 are similar to those of column readout 110. Detector biasing device 206 is similar to detector biasing device 106, detector signal amplifier 201 is similar to detector signal amplifier 101, and column multiplexer 214 is similar to column multiplexer 114.

As shown in FIG. 2, a global analog-to-digital convertor (ADC) 208 may be connected to buffer 212 and comparator 234. In other embodiments, when there is no buffer 212, ADC 208 may be connected to column multiplexer 214. ADC 208 may be configured to digitize the output signal received from either buffer 212 or column multiplexer 214 and received by comparator 234. In some embodiments, ADC 208 may reside on the ROIC. In other embodiments, ADC 208 may reside outside of the ROIC.

Comparator 234 may be a digital comparator according to some embodiments. An output signal processed by ADC 208 may subsequently be used to generate new biasing values and apply bias adjustments on subsequent signals during a calibration mode. During the calibration mode, comparator 234 may compare the digitized output with a pre-defined target value, $D_{target}$ in FIG. 2. Similar to comparator 134, after the comparison, comparator 234 may generate and provide binary feedback to controller 202 which generates biasing data to be applied on the corresponding detector and writes it into the memory 204.

Figure 3:
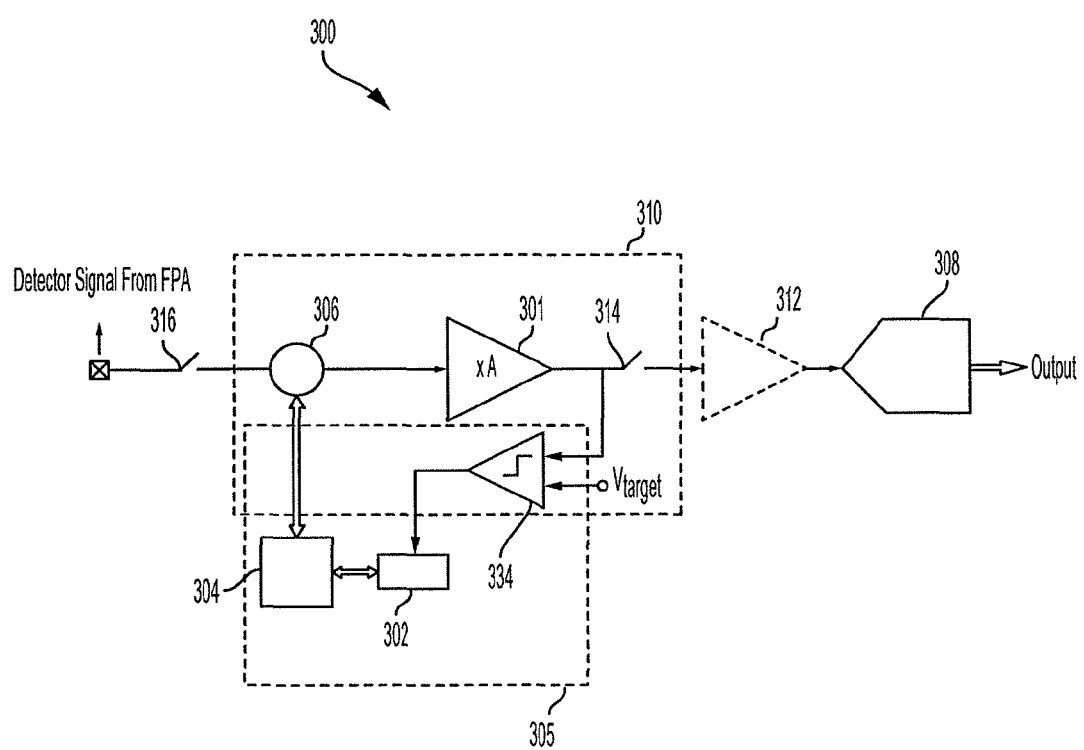
FIG. 3 is a block diagram of a readout circuit that allows on-chip bias calibration of a microbolometer detector focal plane array (FPA), according to an aspect of the invention.

FIG. 3 is a block diagram of system 300, according to various aspects of the invention. System 300 is similar to systems 100 and 200, and like parts are numbered similarly.

System 300 may include a row multiplexer 316 similar to row multiplexers 116 and 216, a buffer 312 similar to buffers 112 and 212, a controller 302 similar to controllers 102 and 202, and a memory 304 similar to memories 104 and 204.

In some embodiments, a global analog-to-digital convertor (ADC) 308 may be connected to buffer 312. In some embodiments, ADC 308 may reside on the ROIC. In other embodiments, ADC 308 may reside outside of the ROIC.

As shown in FIG. 3, a column readout 310 may include a detector biasing device 306, a detector signal amplifier 301, a column multiplexer 314, and a comparator 334. Detector biasing device 306, detector signal amplifier 301, column multiplexer 314, and comparator 334 are all local to column readout 310.

Comparator 334 comprises a local analog comparator configured to compare the resulting detector signal from detector signal amplifier 301 with a reference target voltage, $V_{target}$ in FIG. 3, similar in operation to comparator 134 in FIG. 1. After the comparison, comparator 334 may generate and provide a binary feedback to controller 302 which generates biasing data to be applied on the corresponding detector and writes it into the memory 304.

Figure 4:
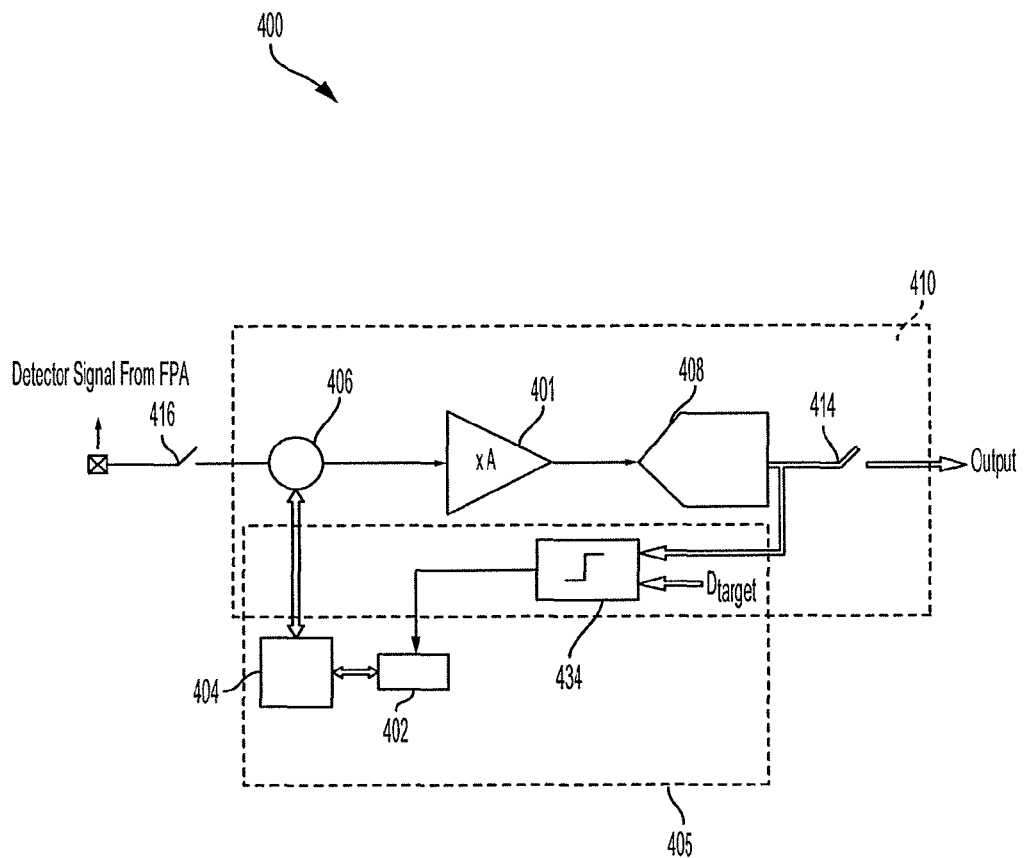
FIG. 4 is a block diagram of a readout circuit that allows on-chip bias calibration of a microbolometer detector focal plane array (FPA), according to an aspect of the invention.

FIG. 4 is a block diagram of system 400, according to various aspects of the invention. System 400 is similar to systems 100, 200, and 300, and like parts are numbered similarly.

System 400 may include a row multiplexer 416 similar to row multiplexers 116, 216, and 316, a controller 402 similar to controllers 102, 202, and 302, and a memory 404 similar to memories 104, 204, and 304.

Likewise, the components of column readout 410 are similar to the components of column readout 310. Detector biasing device 406 is similar to detector biasing device 306, detector signal amplifier 401 is similar to detector signal amplifier 301, and column multiplexer 414 is similar to column multiplexer 314. Column readout 410 may also include a local comparator 434 similar to comparator 334 in FIG. 3 except comparator 434 is digital. Column readout 410 may also include an ADC 408 connected to column multiplexer 414 and comparator 434.

ADC 408 may be configured to digitize the output signal received from detector signal amplifier 401 and received by comparator 434. In some embodiments, the detector signal from ADC 408 may be subsequently used to generate new biasing values and apply bias adjustments on subsequent signals during a calibration mode. During the calibration mode, comparator 434 may compare the digitized output with a pre-defined target value, $D_{target}$ in FIG. 4. Similar to comparator 234, after the comparison, comparator 434 may generate and provide binary feedback to controller 402 which generates biasing data to be applied on the corresponding detector and writes it into the memory 404.

As shown in FIG. 4, column readout 410 may include a detector biasing device 406, a detector signal amplifier 401, a local ADC 408, a column multiplexer 414, and a digital comparator 434 all local to column readout 410.

Figure 5:
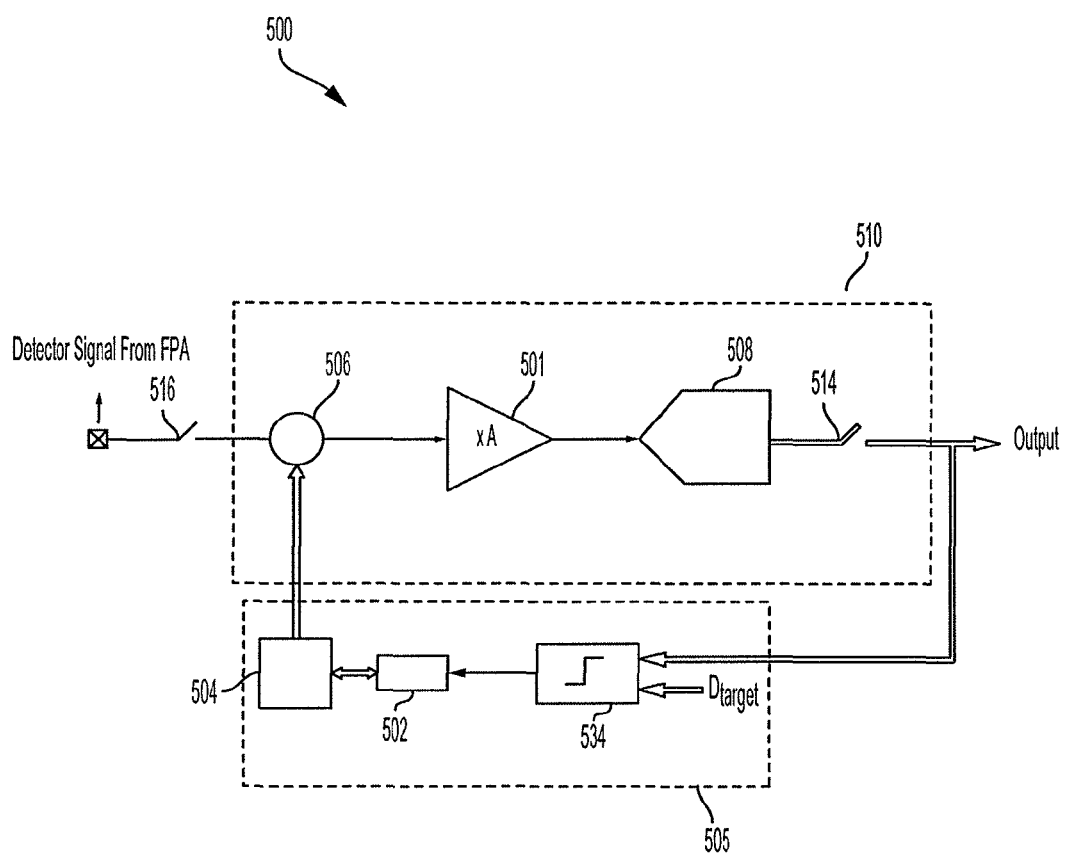
FIG. 5 is a block diagram of a readout circuit that allows on-chip bias calibration of a microbolometer detector focal plane array (FPA), according to an aspect of the invention.

FIG. 5 is a block diagram of system 500, according to various aspects of the invention. System 500 is similar to systems 100, 200, 300 and 400, and like parts are numbered similarly.

System 500 may include a row multiplexer 516 similar to row multiplexers 116, 216, 316, and 416, a controller 502 similar to controllers 102, 202, 302, and 402, and a memory 504 similar to memories 104, 204, 304, and 404.

Likewise, the components of column readout 510 are similar to the components of column readout 410. Detector biasing device 506 is similar to detector biasing device 406, detector signal amplifier 501 is similar to detector signal amplifier 401, ADC 508 is similar to ADC 408, and column multiplexer 514 is similar to column multiplexer 414.

As shown in FIG. 5, column readout 510 may include a detector biasing device 506, a detector signal amplifier 501, a local ADC 508, and a column multiplexer 514. Detector biasing device 506, detector signal amplifier 501, ADC 508, and column multiplexer 514 all being local to column readout 510.

In some embodiments, comparator 534 may be a global digital comparator. That is, comparator 534 is not local to column readout 510. Comparator 534 may be connected to column multiplexer 514 and controller 502, as depicted in FIG. 5. An output signal processed by column multiplexer 514 may then be used to calibrate subsequent signals during a calibration mode. During the calibration mode, comparator 534 may compare the digitized output with a pre-defined target value $D_{target}$ in FIG. 5. After the comparison, comparator 534 may generate and provide binary feedback to controller 502 which generates biasing data to be applied on the corresponding detector and writes it into the memory 504.

Figure 6:
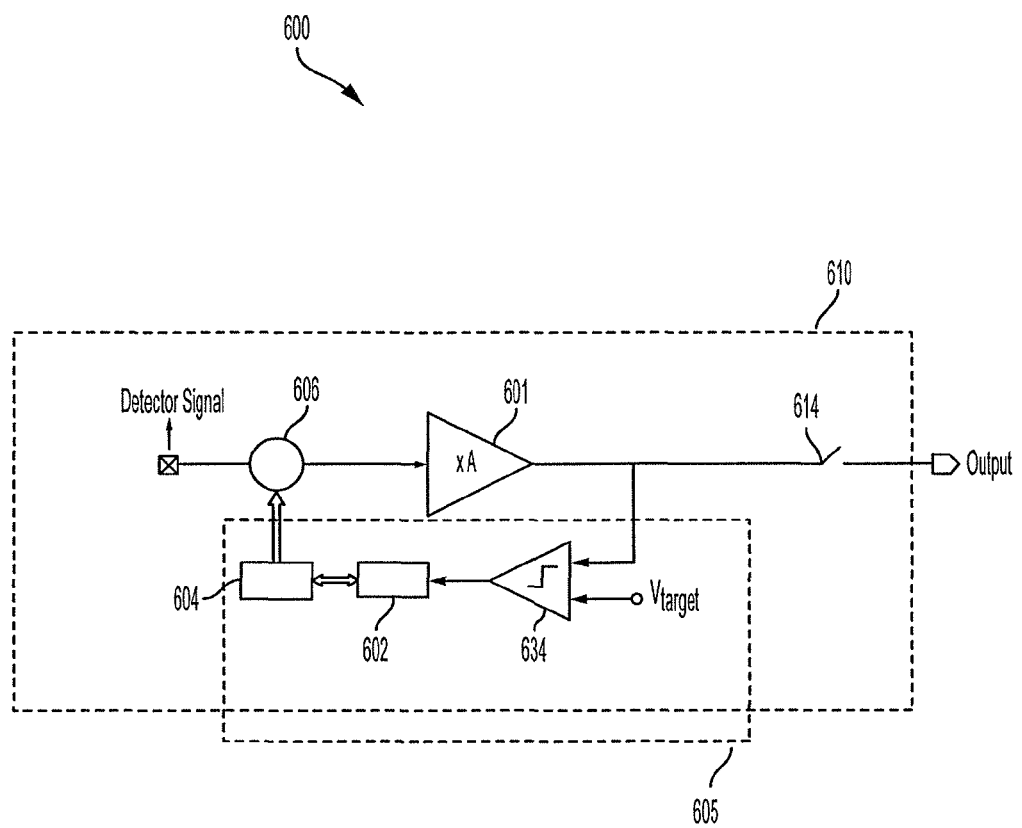
FIG. 6 is a block diagram of a readout circuit that allows on-chip bias calibration of a microbolometer detector focal plane array (FPA), according to an aspect of the invention.

FIG. 6 is a block diagram of system 600, according to various aspects of the invention. System 600 is similar to systems 100, 200, 300, 400, and 500, and like parts are numbered similarly.

System 600 is depicted as utilizing a pixel level readout architecture to perform on-chip bias calibration for each pixel. The number of pixels may be equal to the number of pixel readouts. Thus, each pixel may have its own corresponding system, similar to system 600, for bias calibration. As such, each pixel may have a local calibration memory 604, a local calibration controller 602 and/or a local comparator 634, such as an analog comparator. The local calibration memory 604 may be used for storing calibration data of the corresponding pixel. The local calibration memory 604, the local calibration controller 602, and/or the local analog comparator 634 may be embedded into the pixel level readout circuit. The local analog comparator compares the detector signal amplifier 601 output with a target voltage, $V_{target}$ in FIG. 6, and generates binary feedback to the local calibration controller 602.

Figure 7:
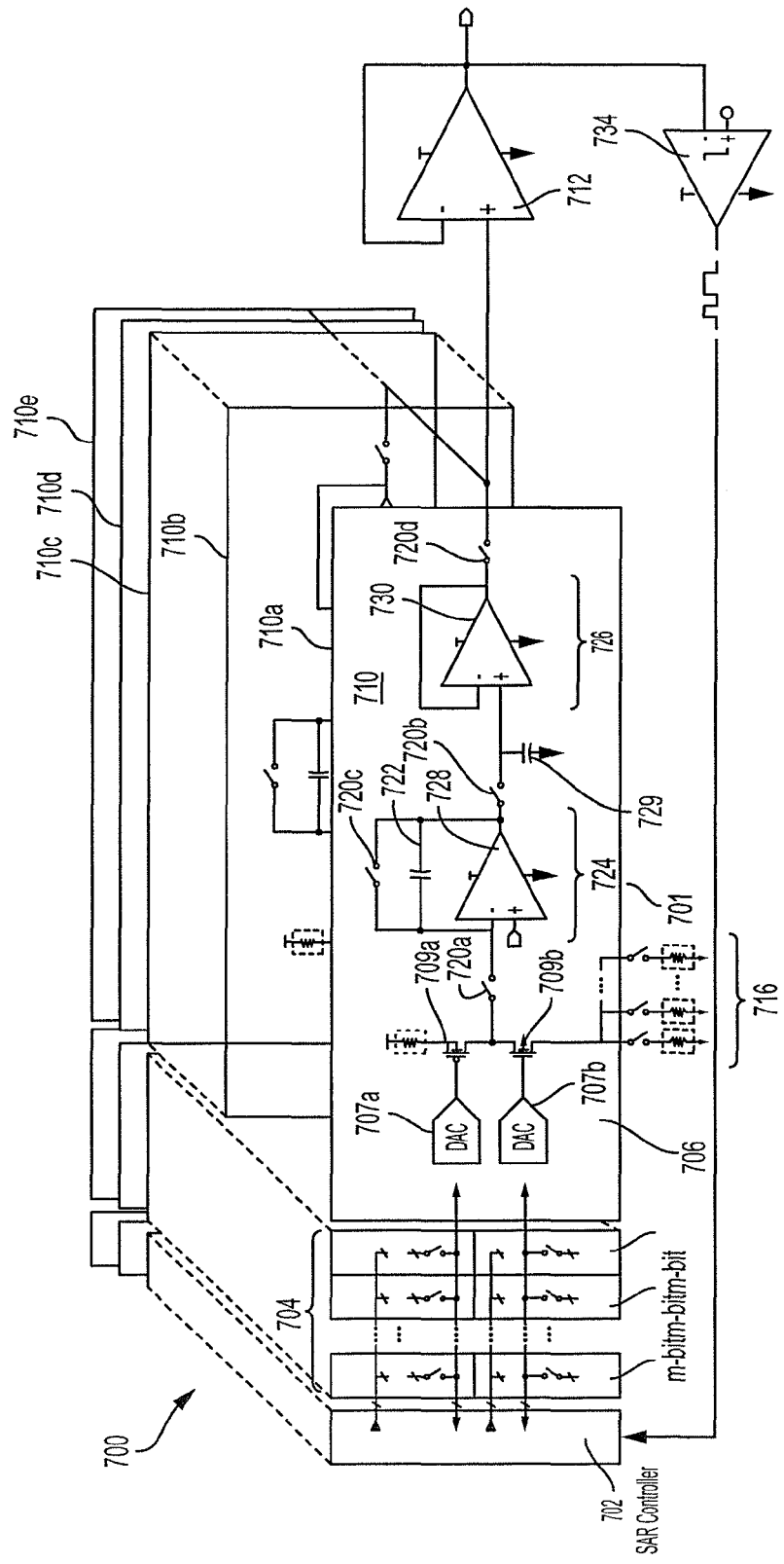
FIG. 7 is an example circuit diagram of a readout architecture that allows on-chip bias calibration according to an aspect of the invention.

FIG. 7 is a circuit diagram of a readout architecture that allows on-chip bias calibration according to an aspect of the invention. The readout circuit 700 is able to self-calibrate the bias voltages with only on-chip components. That is, readout circuit 700 is integrated with the microbolometer detector and is self-calibrating. By having the components on-chip, the amount of electronics on a camera or other device is reduced. Moreover, since the calibration components reside entirely on-chip, the integration of the other device or the camera with the microbolometer detector and/or ROIC is less complex as the amount of communication and/or interfacing between the other devices or the camera with the microbolometer detector and/or ROIC is reduced.

Readout circuit 700 includes a controller 702 that is connected to a memory 704. Controller 702 may be a Successive Approximation Register (SAR) controller. Controller 702 performs a binary search to find a target biasing value for a pixel of the FPA, which the controller 702 stores in memory 704. The target biasing value is an optimum biasing calibration point of a pixel. Controller 702 generates the target biasing value for the pixel. Controller 702 generates calibrated biasing data in accordance with the feedback received from a feedback loop that includes the column multiplexer and an analog/digital buffer 712. Controller 702 reads the calibrated biasing data from memory 704 to generate the bias voltage and writes the calibrated biasing data back into memory 704 for each pixel of the FPA to calibrate the bias voltage. Controller 702 reads the latest calibrated biasing data from memory 704 to generate the bias voltage and writes the newly calibrated biasing data back into memory 704 for each pixel of the FPA to calibrate the bias voltage during calibration mode. The calibrated biasing data for each pixel is a bias calibration that compensates for the non-uniformity of the electrical signal across each pixel in the FPA. Each pixel bias is calibrated so that the electrical signal of each pixel is more uniform across the FPA which reduces noise, increases dynamic range, enables higher readout gains, relaxes input-output voltage swing requirements of the analog circuit blocks inside the readout circuit 100, and expands operating temperature range of the sensor.

Readout circuit 700 includes a memory 704. Memory 704 may be random access memory (RAM) or other volatile or non-volatile memory. Memory 704 may be a non-transitory memory or a data storage device and may further store machine-readable instructions. Memory 704 resides on-chip and may store calibrated biasing data for each pixel that is fed to detector biasing device 706 based on the selected pixel. As shown in FIG. 7, detector biasing device 706 constitutes digital-to-analog converters (DACs) 707a-b and transistors 709a-b.

Readout circuit 700 includes a column readout 710. Column readout 710 may include a detector biasing device 706, a detector signal amplifier 701 that amplifies the signal and/or column multiplexer 714. Column readout 710 may have multiple column readout circuits 710a-e used to read output of the pixels in each row and column. The column readout circuits may be of any number, and pixels connected to column readout circuits 710*a-e* are selected row-by-row through the dynamic row decoder which performs dynamic row selection.

Detector biasing device 706 may be composed of a single or multi-stage voltage or current mode digital-to-analog converter (DAC) 707*a-b* and transistors 709*a-b*. DACs 707*a-b*, connected to memory 704, generates a bias voltage or a current of a pixel for the microbolometer detector and feeds the bias voltage or the current to the one or more transistors 709*a-b* of column readout 710 based on the biasing data value of the corresponding pixel.

Each of the one or more DACs 707*a-b* may have a multi-bit (m-bit) input and an output that connects to one or more transistors 709*a-b*. The one or more DACs 707*a-b* may perform an offset correction of the different bias voltages across each pixel. That is, both reference and detector pixel biases for each pixel may be set through the one or more m-bit DACs to equalize the output voltages ($V_{out}$) of all the pixels.

Detector signal amplifier 701 amplifies the signal which is generated by the microbolometer detector with the absorption of incident infrared power. Detector signal amplifier 701 may be formed using one or more transistors 709*a-b*, a switched-capacitor integrator 724 and a line driver 726.

The one or more transistors 709*a-b* may be a p-type metal-oxide-semiconductor (PMOS) transistor and/or an n-type metal-oxide-semiconductor (NMOS) transistor. In some embodiments, the one or more resistors may be connected. The one or more transistors 709*a-b* may have an input that receives biasing voltages, Vp or Vn, from the one or more DACS 707*a-b* and have an output that sends the biasing voltage to the switched-capacitor integrator 724. As the biasing voltages, Vp or Vn, increase, the output voltage, Vout, increases because the integration current, $I_{init}$, decreases.

Switched-capacitor integrator 724 has one or more switches 720*a-c*, switches 720*a* and 720*c*, for example, may be configured to reset a charge on an integration capacitor 722 and an operational amplifier or op-amp 728. The integration capacitor 722 may be charged by the integration current. The switched-capacitor integrator 724 is connected to a capacitor 729, $C_{hold}$, and the output voltage of the pixel may be stored in the capacitor 729, $C_{hold}$. The output voltage of the pixel may be buffered by the line driver 726.

Line driver 726 includes an op-amp 730. Op-amp 730 has an input pin that receives the output voltage from switched-capacitor integrator 724 and another input pin that receives the output voltage from op-amp 730. Line driver 726 buffers the output voltage and provides the output voltage to the column multiplexer which multiplexes the output voltage and provides it to analog/digital buffer 712.

Readout circuit 700 includes a feedback loop that is formed from controller 702, memory 704, column multiplexer and analog/digital buffer 712. Column multiplexer 720*d* performs dynamic column selection and multiplexes the output voltage of each pixel for a selected row that is selected by the dynamic row decoder. The row decoder selects a row by closing the corresponding switch. Column multiplexer 720*d* and analog/digital buffer 712 provides an analog or digitized pixel output feedback to the comparator 734. In some embodiments, each of the column readout circuits 710*a-e* includes a comparator 734.

Comparator 734 may compare the output voltage with a reference voltage and provides feedback to controller 702. The reference voltage may be a target voltage that is uniform across all pixels of the FPA so that the output voltage of each pixel of the FPA is the same. During calibration, the binary output of comparator 734 is latched by controller 702. A timing generator may generate the necessary timing for readout circuit 700 and latches output of the comparator 734. The latching of output of the comparator 734 is performed synchronously with the output switch. Comparator 734 may be connected to the output of switched-capacitor integrator 724 or line driver 726 to generate the biasing voltage of the pixels in the same row, simultaneously. Comparator 734 provides a binary output voltage to controller 702 which generates biasing data to be applied on the corresponding detector and writes it into the memory 704.

Figure 8:
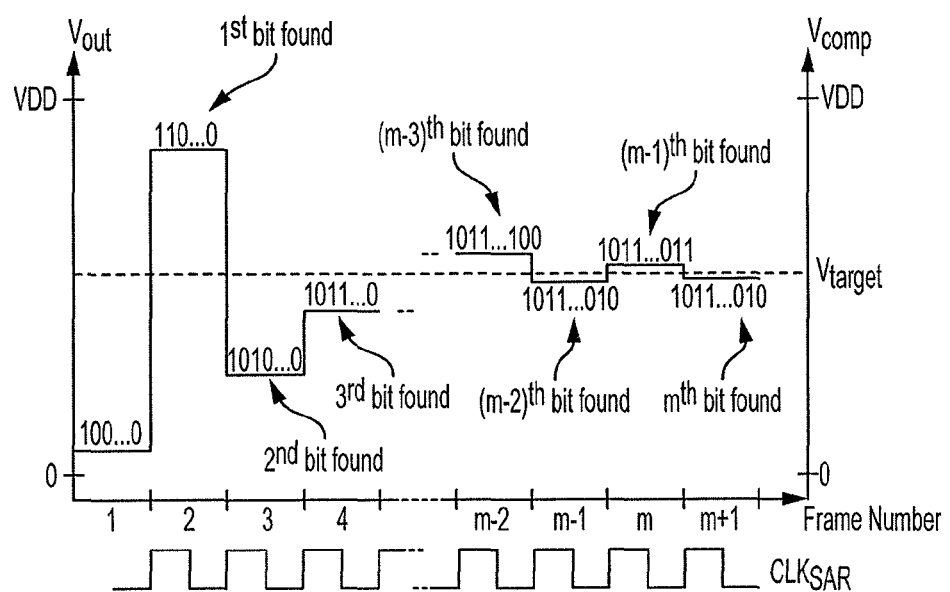
FIG. 8 is a graph of an example of the readout circuit performing a binary search according to an aspect of the invention.

FIG. 8 is a graph of the readout circuit 100 performing the binary search according to an aspect of the invention. The readout circuit 100 may implement the binary search using controller 102 of the readout circuit 100 to calibrate the biasing voltages of each pixel. The calibration starts with setting the bias values of all pixels, both reference pixels and/or detector pixels depending on the calibration mode, as the middle of the DAC voltage range. A biasing value of a pixel that is set in the middle of the DAC range corresponds to setting a most significant bit (MSB) of the biasing value to 1 and the remaining bits to 0. During a read state, the output voltage of comparator 134 is checked by controller 102 and a new detector biasing data is generated which is then written into memory 104 for the corresponding pixel. After setting the MSB, the output voltage is provided to comparator 134 which compares the output voltage to the reference voltage or target voltage. If the output voltage is greater than the target voltage then the corresponding bit is set to 0, otherwise, the corresponding bit is set to 1 when the output voltage is less than the target voltage. The biasing value is written into memory 104 for the corresponding pixel. Depending on the detector biasing architecture and comparator input connections, the 1's and 0's may change. Readout circuit 100 shifts to the next bit to repeat the comparison between the output voltage and the target voltage and to write the biasing value into the corresponding pixel. This process is repeated until the least significant bit of the biasing value is calculated where the final biasing value stored produces an output voltage that is approximately equivalent to the target voltage.

Figure 9:
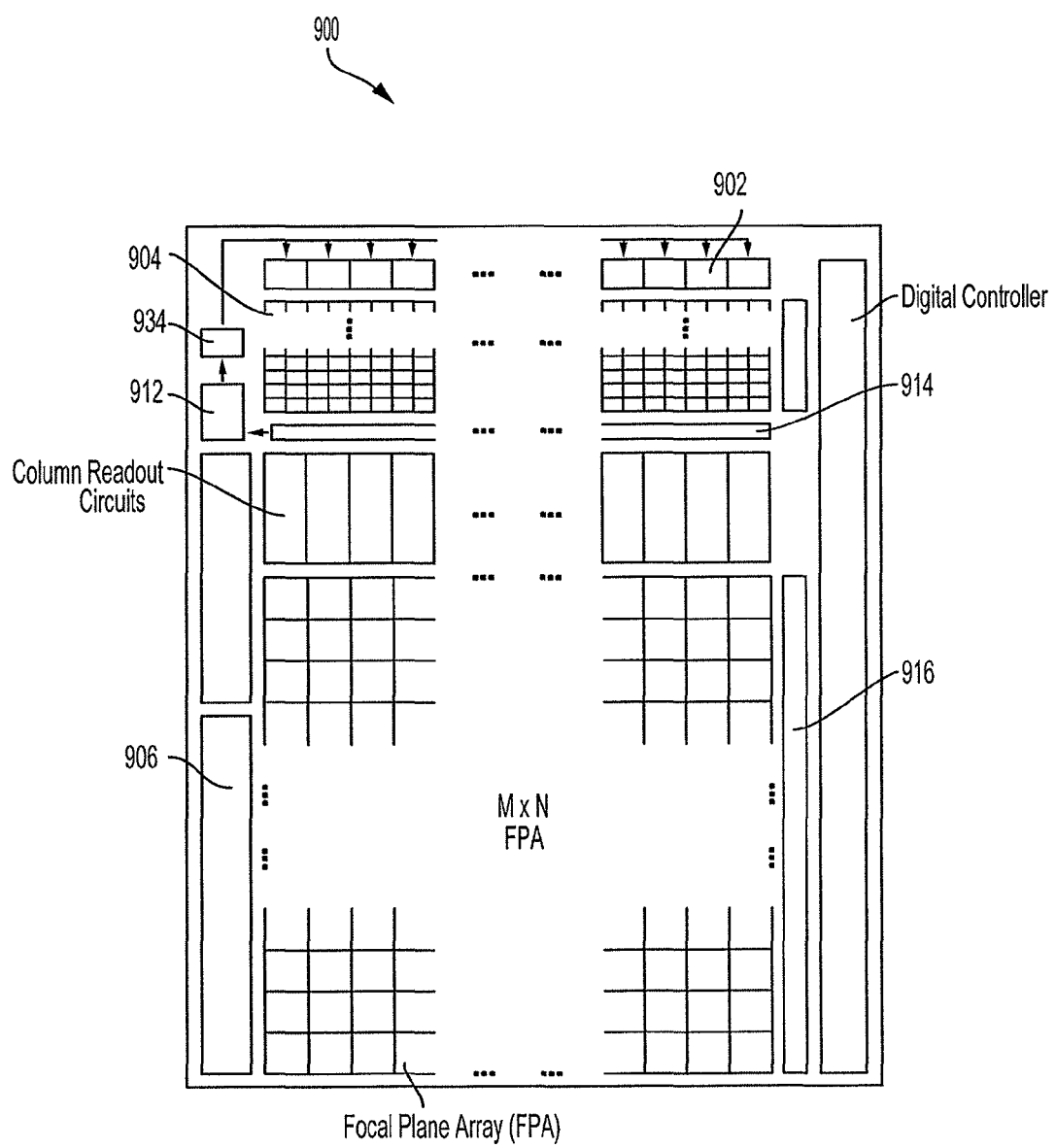
FIG. 9 is an example readout circuit layout according to an aspect of the invention.

FIG. 9 is an example readout circuit layout 900 according to an aspect of the invention. Readout circuit layout 900 is similar to systems 100, 200, 300, 400, 500, and 600, and like parts are numbered similarly.

Readout circuit layout 900 may include a memory 904 similar to memories 104, 204, 304, 404, 504, and 604, a controller 902 similar to controllers 102, 202, 302, 402, 502, and 602, a column multiplexer 914 similar to column multiplexers 114, 214, 314, 414, and 514, a row multiplexer 916 similar to row multiplexers 116, 216, 316, 416, and 516, a detector biasing device 906 similar to detector biasing devices 106, 206, 306, 406, 506, and 606, a buffer 912 similar to buffer 112, 212, and 312, and a comparator 934 similar to comparators 134, 234, 334, 434, 534, and 634.

As shown in FIG. 9, the components of the readout circuit layout 900 and the FPA all reside on a readout integrated circuit.

Figure 10:
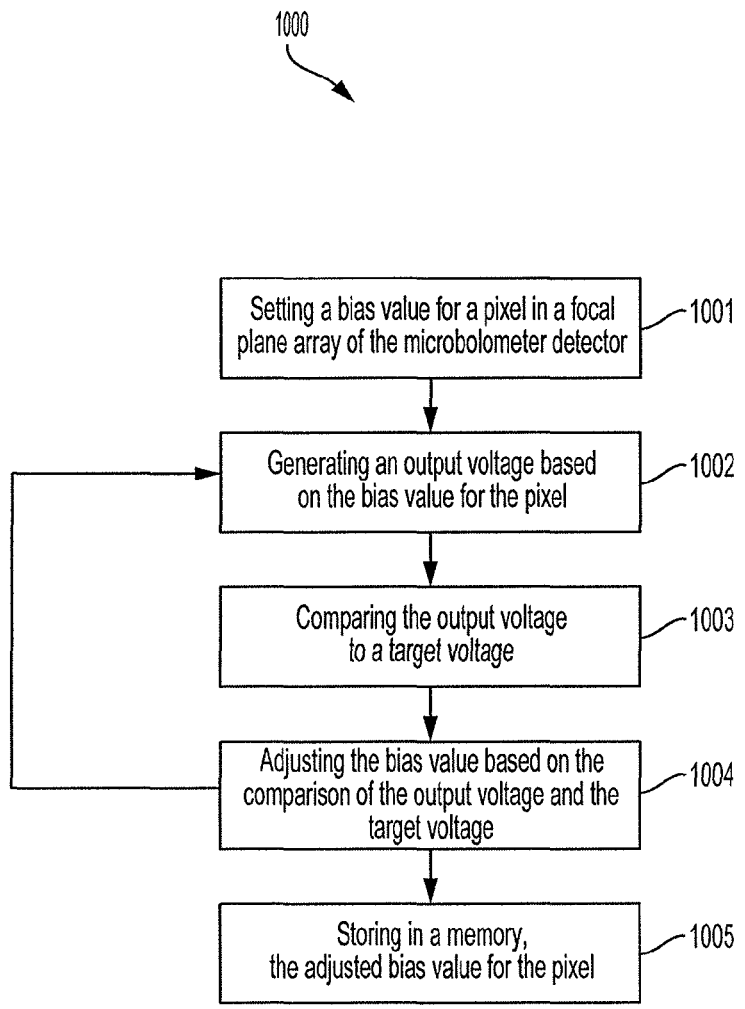
FIG. 10 is a flowchart for a method for on-chip bias calibration of a microbolometer detector according to an aspect of the invention.

FIG. 10 is a flowchart for a method for on-chip bias calibration of a microbolometer detector according to an aspect of the invention. A readout circuit may be configured to set a bias value for a pixel in a focal plane array of a microbolometer detector (Step 1001). In some embodiments, the setting of the bias value may be performed by a column readout of the readout circuit. In other embodiments, the setting of the bias value may be performed by a controller of the readout circuit.

The readout circuit may then generate an output voltage based on the bias value for the pixel (Step 1002). The amount of generated output voltage is dependent on the detector biasing device output. In some embodiments, the readout circuit may then generate an output current based on the bias value for the pixel.

The readout circuit may then compare the output voltage to a target voltage (Step 1003). In some embodiments, the comparison of the output voltage to a target voltage may be performed by a comparator. The comparator may be configured to be an analog or a digital comparator. In some embodiments, readout circuit may compare the output current to a target current.

The readout circuit may then adjust the bias value based on the comparison of the output voltage and the target voltage (Step 1004). The adjustment of the bias value may be performed by a controller. In some embodiments, the readout circuit may adjust the bias value based on the comparison of the output current and the target current. In some embodiments, after the readout circuit has adjusted the bias value in Step 1004, the readout circuit may then repeat Step 1002 and generate a new output voltage based on the bias value for the pixel. This may occur over a discrete number of stages or may be part of continuous loop.

In some embodiments, the adjusting of the bias value could comprise setting a bit of the bias value to 0 when the output voltage is greater than the target voltage. The adjusting of the bias value could additionally comprise setting the bit of the bias value to 1 when the output voltage is less than the target voltage.

In other embodiments, the adjusting of the bias could comprise setting a bit of the bias value to 1 when then output voltage is greater than the target voltage. The adjusting of the bias value could additionally comprise setting the bit of the bias value to 0 when the output voltage is less than the target voltage.

The readout circuit may then store, in a memory, the adjusted bias value for the pixel (Step 1005). The storing of the adjusted bias value for the pixel may be performed by the controller.

The foregoing description of the disclosed example embodiments is provided to enable any person of ordinary skill in the art to make or use the present invention. Various modifications to these examples will be readily apparent to those of ordinary skill in the art, and the principles disclosed herein may be applied to other examples without departing from the spirit or scope of the present invention. The described embodiments are to be considered in all respects only as illustrative and not restrictive and the scope of the invention is, therefore, indicated by the following claims rather than by the foregoing description. All changes which come within the meaning and range of equivalency of the claims are to be embraced within their scope.

What is claimed is:

1. A readout circuit that allows on-chip bias calibration of a microbolometer focal plane array (FPA), comprising:
    a memory for storing one or more biasing values for a plurality of pixels within the FPA, the plurality of pixels being arranged in one or more columns and one or more rows within the FPA;
    a column readout connected to the memory and configured to search for the one or more biasing values and to apply a bias adjustment based on the one or more biasing values to a signal received from the FPA;
    a detector biasing device connected to the column readout and configured to generate the one or more biasing values based on feedback from the memory;
    a reference detector connected to the detector biasing device and configured to cancel unwanted signals from the FPA; and
    a column multiplexer connected to the column readout and configured to perform dynamic column selection for one or more columns of pixels within the FPA.

2. The readout circuit of claim 1, further comprising:
    a comparator configured to create a feedback by comparing the signal received from the column readout to a reference value, the feedback being used to adjust the one or more biasing values.

3. The readout circuit of claim 2, further comprising:
    a controller connected to the memory and the comparator, the controller being configured to generate calibration data based on the feedback from the comparator, the controller being configured to write the generated calibration data into the memory.

4. The readout circuit of claim 3, wherein the FPA, the memory, the controller, and the comparator are configured to reside on a readout integrated circuit.

5. The readout circuit of claim 3, wherein the controller is a successive approximation register (SAR) and is further configured to perform a binary search to find the one or more biasing values to be used in the adjustment of the one or more biasing values.

6. The readout circuit of claim 1, further comprising:
    a digital controller configured to generate timings for the application of the bias adjustment by the column readout, timings for controlling switches in the column readout, timings for communicating with external electronics, and timings for dynamic column selection by the column multiplexer.

7. The readout circuit of claim 1, further comprising:
    an output buffer connected to the column multiplexer and configured to output a resulting signal from the column multiplexer.

8. The readout circuit of claim 1, wherein the readout circuit further comprises:
    a row multiplexer connected to the column readout and configured to perform dynamic row selection for one or more rows within the FPA.

9. The readout circuit of claim 1, wherein the column readout includes a detector signal amplifier connected to the column multiplexer, the detector signal amplifier being configured to amplify the output signal after the bias adjustment has been applied.

10. The readout circuit of claim 9, wherein the detector signal amplifier comprises a plurality of transistors that include either a P-type metal-oxide-semiconductor (PMOS) transistor and an N-type metal-oxide-semiconductor (NMOS) transistor or a PNP-type bi-polar junction transistor and an NPN-type b-polar junction transistor (BJT).

11. The readout circuit of claim 1, wherein the components of the readout circuit are configured to all reside on a readout integrated circuit.

12. A method for on-chip bias calibration of a microbolometer detector, comprising:
    setting a bias value for a pixel in a focal plane array (FPA) of the microbolometer detector;
    generating an output voltage based on the bias value for the pixel;
    comparing the output voltage to a target voltage uniform across all pixels of the FPA;
    adjusting the bias value based on the comparison of the output voltage and the target voltage; and
    storing, in a memory, the adjusted bias value for the pixel.

13. The method of claim 12, wherein adjusting the bias value includes:
setting a bit of the bias value to 0 when the output voltage is greater than the target voltage; and
setting the bit of the bias value to 1 when the output voltage is less than the target voltage.

14. The method of claim 12, wherein adjusting the bias value includes:
setting a bit of the bias value to 1 when the output voltage is greater than the target voltage; and
setting the bit of the bias value to 0 when the output voltage is less than the target voltage.

15. A readout circuit that allows on-chip bias calibration of a microbolometer focal plane array (FPA), comprising:
a memory for storing a biasing value for a pixel, the pixel being one of a plurality of pixels within the FPA;
a detector biasing device connected to the memory, the detector biasing device being configured to search for the biasing value and to apply a bias adjustment based on the biasing value;
a reference detector connected to the detector biasing device and configured to cancel unwanted signals from the FPA;
a detector signal amplifier connected to the detector biasing device and configured to amplify the output signal; and
a detector signal multiplexer connected to the detector signal amplifier.

16. The readout circuit of claim 15, further comprising:
a comparator configured to create a feedback by comparing the signal received from the FPA to a reference value, the feedback being used to adjust the one or more biasing values.

17. The readout circuit of claim 16, further comprising:
a controller connected to the memory and the comparator, the controller being configured to generate calibration data based on the feedback from the comparator, the controller being configured to write the generated calibration data into the memory.

18. The readout circuit of claim 17, wherein the controller is a successive approximation register (SAR) and is further configured to perform a binary search to find the one or more biasing values to be used in the adjustment of the one or more biasing values.

19. The readout circuit of claim 17, wherein the FPA, the controller, the memory, and the comparator are configured to reside on a readout integrated circuit.

20. The readout circuit of claim 15, wherein the components of the readout circuit are all configured to reside on a readout integrated circuit.

* * * * *